(12) United States Patent  
Saitoh et al.

(10) Patent No.: US 10,971,566 B2  
(45) Date of Patent: Apr. 6, 2021

(54) DISPLAY DEVICE INCLUDING FRAME WIRING IN BENDING SECTION

(71) Applicant: Sharp Kabushiki Kaisha, Sakai (JP)

(72) Inventors: Takao Saitoh, Sakai (JP); Masaki Yamanaka, Sakai (JP); Yohsuke Kanzaki, Sakai (JP); Masahiko Miwa, Sakai (JP); Seiji Kaneko, Sakai (JP)

(73) Assignee: SHARP KABUSHIKI KAISHA, Sakai (JP)

( * ) Notice: Subject to any disclaimer, the term of this patent is extended or adjusted under 35 U.S.C. 154(b) by 0 days.

(21) Appl. No.: 16/463,858

(22) PCT Filed: Sep. 28, 2017

(86) PCT No.: PCT/JP2017/035177  
§ 371 (c)(1),  
(2) Date: May 24, 2019

(87) PCT Pub. No.: WO2019/064414  
PCT Pub. Date: Apr. 4, 2019

(65) Prior Publication Data  
US 2020/0388660 A1 Dec. 10, 2020

(51) Int. Cl.  
*H01L 27/32* (2006.01)  
*H01L 51/00* (2006.01)

(52) U.S. Cl.  
CPC ...... *H01L 27/3258* (2013.01); *H01L 27/3276* (2013.01); *H01L 51/0097* (2013.01); *H01L 2227/323* (2013.01)

(58) Field of Classification Search  
CPC ............ H01L 27/3258; H01L 27/3276; H01L 51/0097; H01L 2227/323  
See application file for complete search history.

(56) References Cited

U.S. PATENT DOCUMENTS

| 6,583,062 | B1 | 6/2003 | Ma et al. |
| 2010/0301450 | A1 | 12/2010 | Lin |
| 2014/0353670 | A1 | 12/2014 | Youn et al. |
| 2017/0170206 | A1* | 6/2017 | Lee ................... H01L 29/78633 |
| 2019/0355800 | A1* | 11/2019 | Saitoh ................. H01L 27/3246 |

FOREIGN PATENT DOCUMENTS

| JP | 2014-232300 A | 12/2014 |
| WO | 2016/157321 A1 | 10/2016 |

OTHER PUBLICATIONS

Official Communication issued in International Patent Application No. PCT/JP2017/035177, dated Dec. 5, 2017.

* cited by examiner

*Primary Examiner* — Lex H Malsawma  
(74) *Attorney, Agent, or Firm* — Keating & Bennett, LLP

(57) ABSTRACT

At a bending section of a frame region, an opening portion is formed, in at least one inorganic insulating film included in the TFT layer, through the at least one inorganic insulating film to expose an upper surface of a resin substrate, and a frame wiring line is provided on the resin substrate exposed through the opening portion, and among the at least one inorganic insulating film included in the TFT layer, an inorganic insulating film being in contact with the upper surface of the resin substrate is formed with a silicon oxynitride film.

17 Claims, 14 Drawing Sheets

DISPLAY DEVICE INCLUDING FRAME WIRING IN BENDING SECTION

TECHNICAL FIELD

The disclosure relates to an organic EL display device and a method for manufacturing the same.

BACKGROUND ART

In recent years, organic EL display devices, which use organic electroluminescence (EL) elements and are of the self-luminous type, have attracted attention as a display device that can replace the liquid crystal display device. As the organic EL display device, a flexible organic EL display device, in which an organic EL element or the like is formed on a flexible resin substrate has been proposed. In the organic EL display device, a rectangular display region for displaying an image and a frame region formed around the display region are provided, where reduction of the frame region is demanded. In the flexible organic EL display device, for example, if the frame region is reduced by bending the frame region being on the terminal side, the wiring line arranged in the frame region may be broken.

For example, PTL 1 discloses a flexible display device that forms a bending hole, thus removing a part of each of a buffer film, a gate insulating film, and an interlayer insulating film each corresponding to the bending region, and thus preventing disconnection of the wiring line.

CITATION LIST

Patent Literature

PTL 1: JP 2014-232300 A

SUMMARY

Technical Problem

Incidentally, a flexible organic EL display device is provided with an inorganic insulating film such as a base coat film, a gate insulating film, or an interlayer insulating film on the resin substrate, thus, the inorganic insulating film may occasionally be removed by dry etching on the portion at a bending section of a frame region to suppress breakage of wiring lines arranged in the frame region, to thus prevent the inorganic insulating film from being broken at the bending section. In consideration of the coatability of a metal film for forming the wiring lines to be formed on the portion from which the inorganic insulating film at the bent portion of the frame region has been removed, the angle (taper angle) relative to the resin substrate surface being at the end face of the portion from which the inorganic insulating film has been removed may rather be minimized. The silicon oxide film as the material used for the inorganic insulating film, which makes it possible to reduce the taper angle than the taper angle of the silicon nitride film, overlaps the light emission of plasma due to oxygen in the resist, so that the end point of dry etching becomes hard to be detected. Accordingly, there exists a trade-off relationship between a reduction of the taper angle at the end face of the inorganic insulating film and a reliable detection of the end point of the dry etching of the inorganic insulating film.

The disclosure has been achieved in view of the above, and an object of the disclosure is to ensure a reliable detection of the end point of dry etching of an inorganic insulating film as well as to reduce the taper angle at the end face of the inorganic insulating film.

Solution to Problem

In order to achieve the above object, a display device according to the disclosure includes a resin substrate, a light-emitting element included in a display region, the light-emitting element being provided over the resin substrate with a TFT layer in between, a frame region provided around the display region, a terminal section provided at an end portion of the frame region, a bending section provided between the display region and the terminal section, a frame wiring line provided in the frame region, the frame wiring line extending to the terminal section with being electrically connected to the light-emitting element, and at least one inorganic insulating film provided in the frame region, the at least one inorganic insulating film being overlaid on the resin substrate and being included in the TFT layer, wherein at the bending section, an opening portion is formed through the at least one inorganic insulating film to expose an upper surface of the resin substrate, wherein the frame wiring line is provided on the resin substrate exposed through the opening portion, and wherein among the at least one inorganic insulating film, an inorganic insulating film being in contact with the upper surface of the resin substrate is formed with a silicon oxynitride film.

Advantageous Effects of Disclosure

According to the disclosure, among the at least one inorganic insulating film being included in a TFT layer, an inorganic insulating film being in contact with the upper surface of the resin substrate is formed with a silicon oxynitride film, thus ensuring a reliable detection of the end point of the dry etching of the inorganic insulating film as well as making it possible to reduce the taper angle at the end face of the inorganic insulating film.

BRIEF DESCRIPTION OF DRAWINGS

FIG. 11 is a view corresponding to FIG. 6.

FIG. 12 is a view corresponding to FIG. 7.

FIG. 13 is a view corresponding to FIG. 6.

DESCRIPTION OF EMBODIMENTS

Embodiments of the disclosure will be described below in detail with reference to the drawings. The disclosure is not limited to the embodiments described below.

First Embodiment

Figure 1:
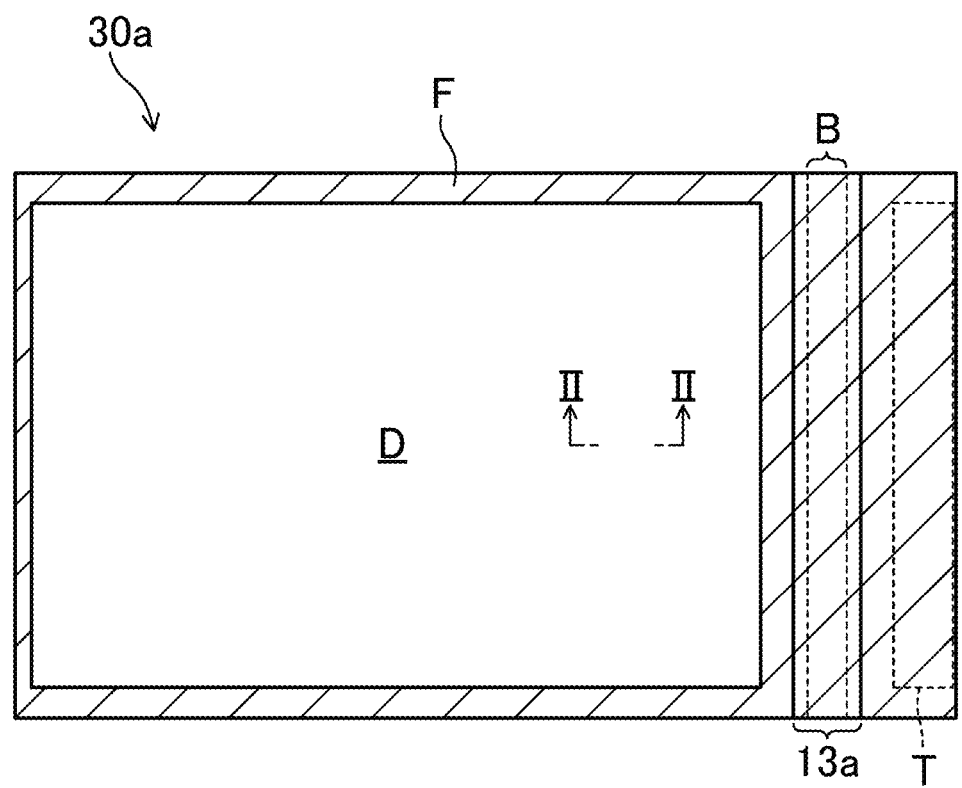
FIG. 1 is a plan view of an organic EL display device according to a first embodiment of the disclosure, schematically illustrating an overall configuration of the device.
Figure 2:
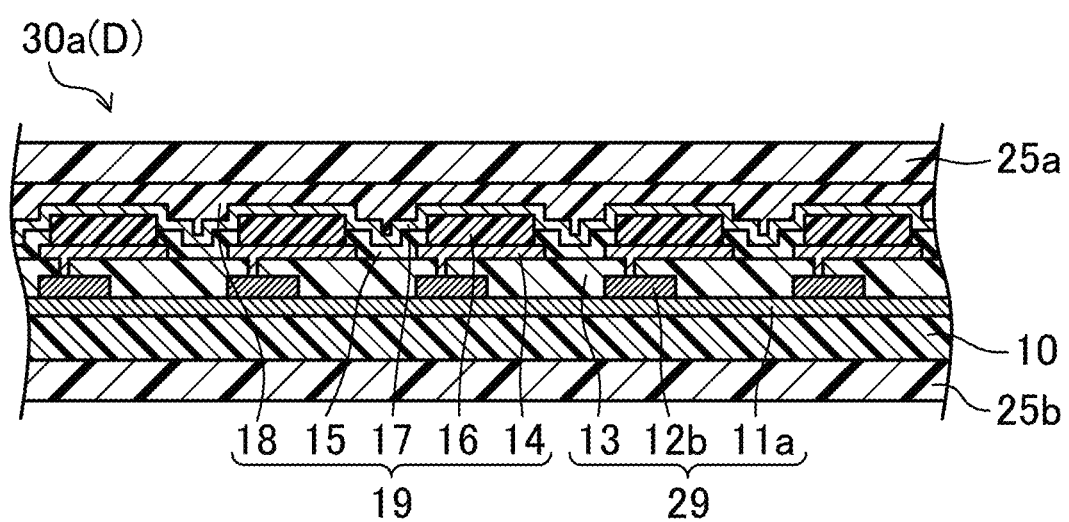
FIG. 2 is a cross-sectional view of a display region of the organic EL display device taken along the line II-II in FIG. 1, schematically illustrating an overall configuration of the display region.
Figure 3:
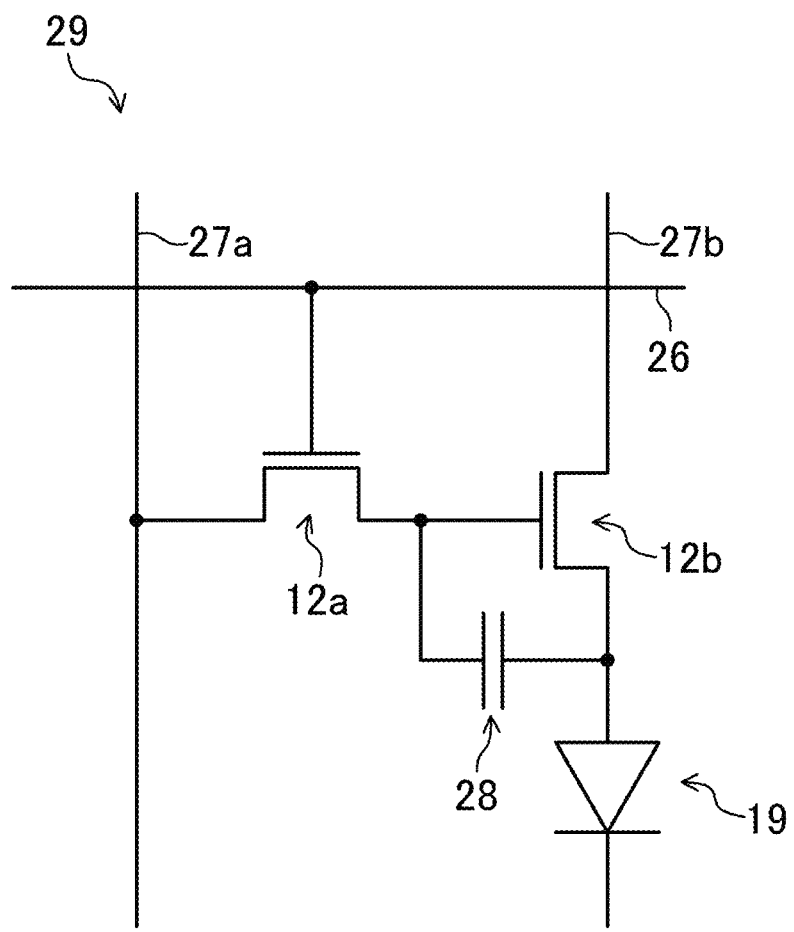
FIG. 3 is an equivalent circuit diagram illustrating a TFT layer included in the organic EL display device according to the first embodiment of the disclosure.
Figure 4:
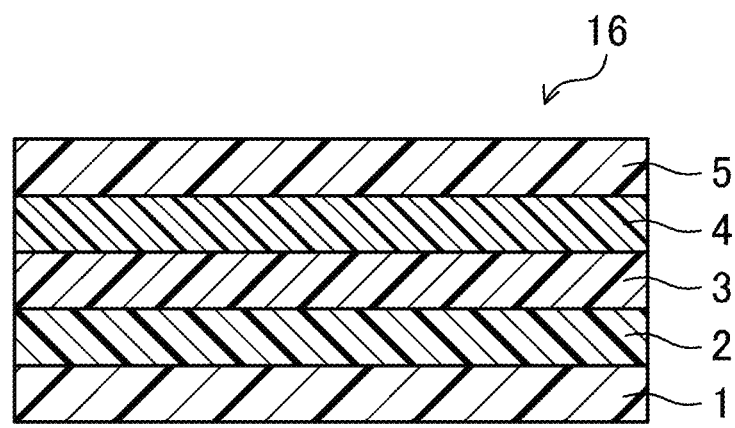
FIG. 4 is a cross-sectional view illustrating an organic EL layer included in the organic EL display device according to the first embodiment of the disclosure.
Figure 5:
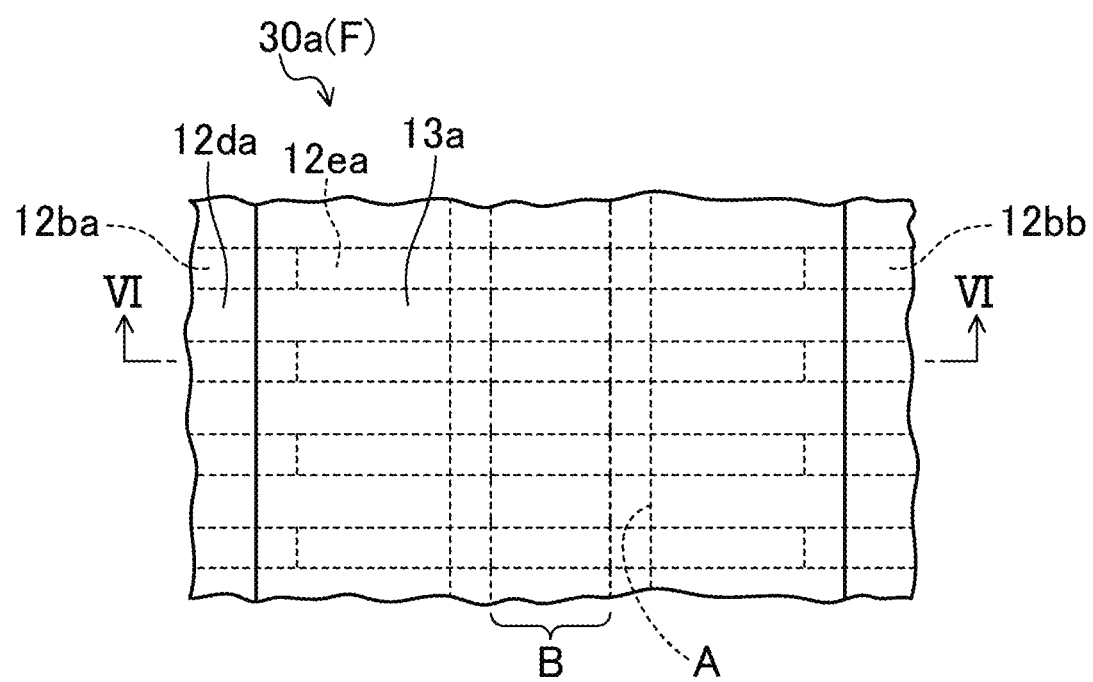
FIG. 5 is a plan view illustrating a bending section of a frame region of the organic EL display device according to the first embodiment of the disclosure.
Figure 6:
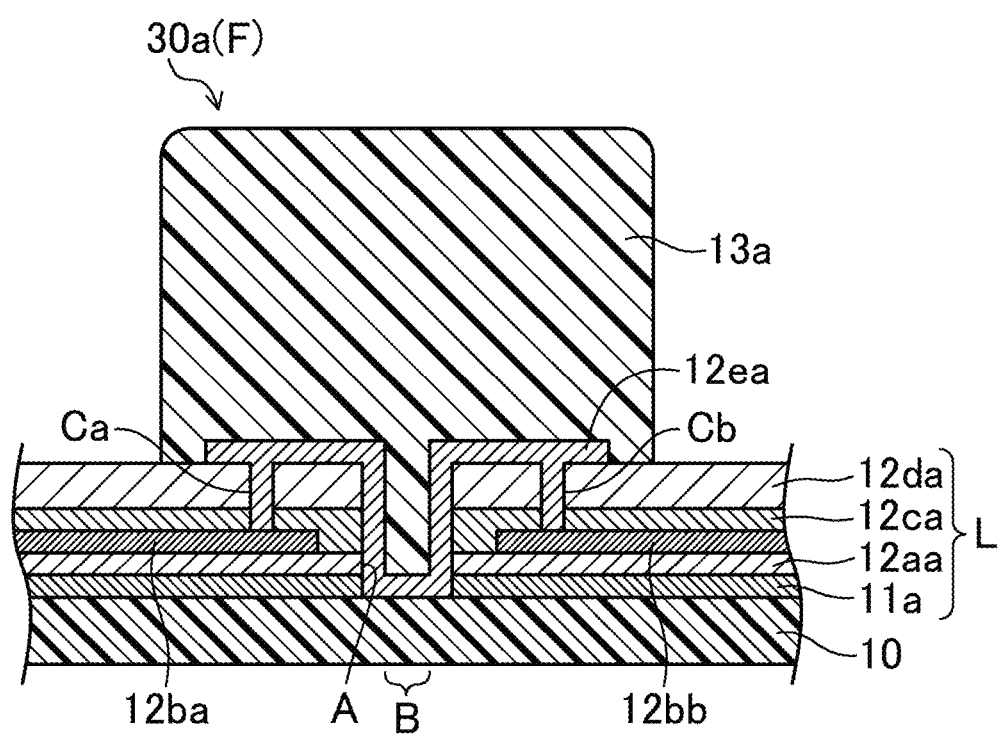
FIG. 6 is a cross-sectional view of a frame region of the organic EL display device taken along the line VI-VI in FIG. 5, schematically illustrating an overall configuration of the frame region.
Figure 7:
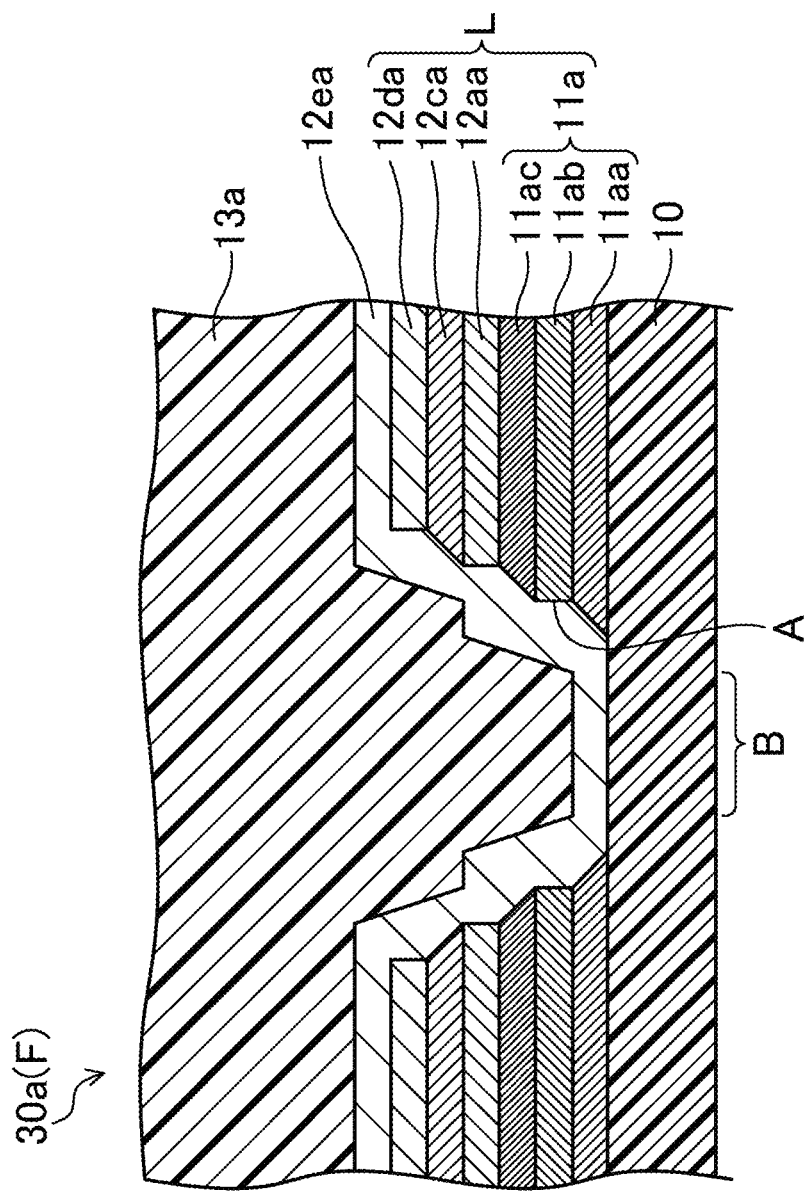
FIG. 7 is an enlarged cross-sectional view of an end portion of an inorganic layered film included in the organic EL display device according to the first embodiment of the disclosure.
Figure 8:
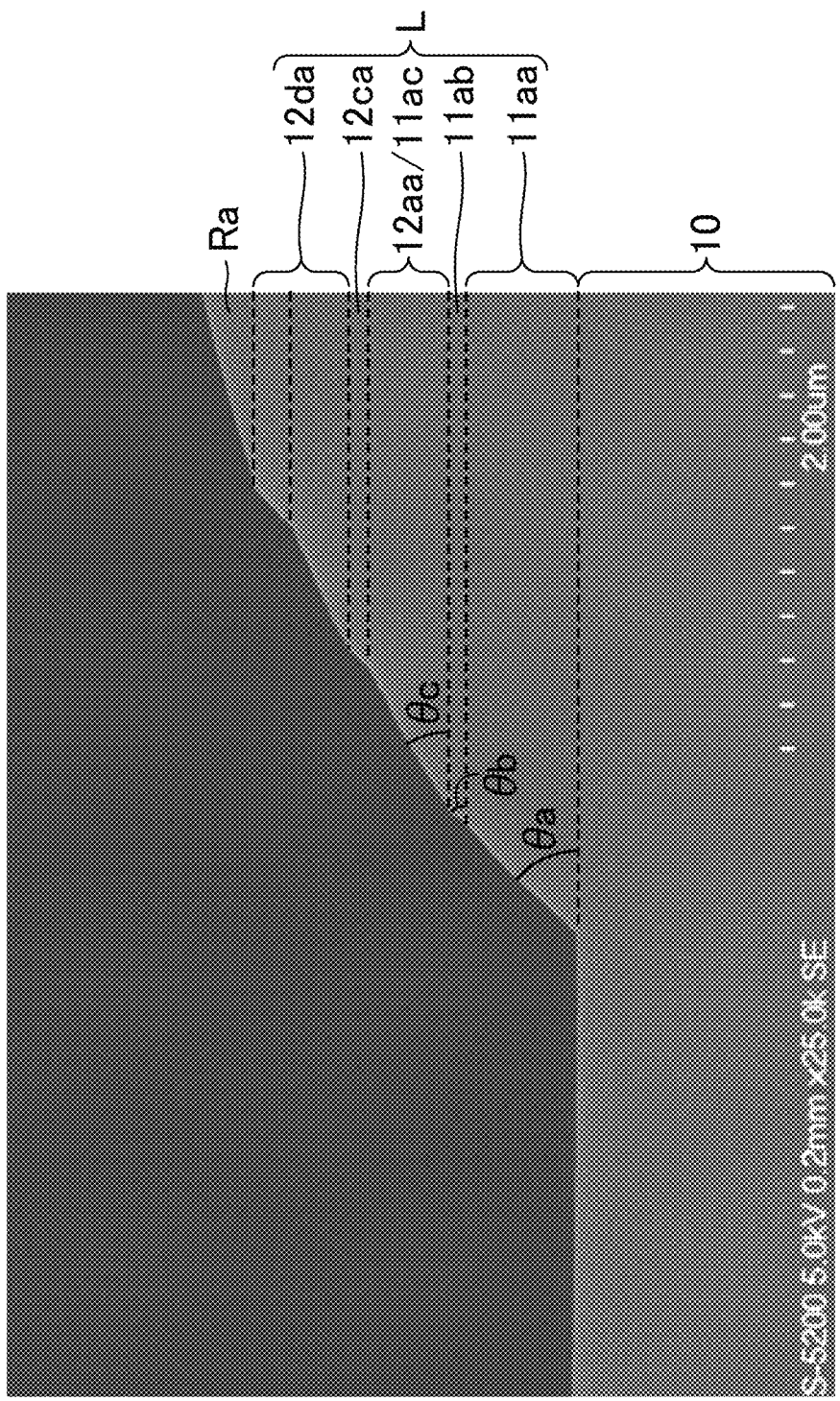
FIG. 8 is a SEM picture of an end portion of an inorganic layered film included in the organic EL display device according to the first embodiment of the disclosure.

FIG. 1 to FIG. 10 illustrate a first embodiment of a display device according to the disclosure. Note that, in each of the following embodiments, an example of an organic EL display device equipped with organic EL elements is given as a display device equipped with light-emitting elements. FIG. 1 is a plan view of an organic EL display device 30a according to the first embodiment, schematically illustrating an overall configuration of the device. FIG. 2 is a cross-sectional view of the organic EL display device 30a taken along the line II-II in FIG. 1, schematically illustrating an overall configuration of the device. FIG. 3 is an equivalent circuit diagram illustrating a TFT layer 29 included in the organic EL display device 30a. FIG. 4 is a cross-sectional view illustrating an organic EL layer 16 included in the organic EL display device 30a. FIG. 5 is a plan view illustrating a bending section B of a frame region F of the organic EL display device 30a. FIG. 6 is a cross-sectional view of the frame region F of the organic EL display device 30a taken along the line VI-VI in FIG. 5, schematically illustrating an overall configuration of the frame region F. FIG. 7 is an enlarged cross-sectional view of an end portion of an inorganic layered film L included in the organic EL display device 30a, specifically illustrating FIG. 6. FIG. 8 is a SEM picture of the end portion of the inorganic layered film L included in the organic EL display device 30a, which is taken with a scanning electron microscope (SEM).

As illustrated in FIG. 1, the organic EL display device 30a includes a display region D for displaying an image defined in a rectangular shape, and the frame region F (hatched portions in the drawing) defined around the display region D. As illustrated in FIG. 2, the display region D of the organic EL display device 30a is provided with organic EL elements 19 and in the display region D, a plurality of pixels are arranged in a matrix pattern. Further, each of the pixels in the display region D includes, for example, a subpixel for display of red grayscale, a subpixel for display of green grayscale, and a subpixel for display of blue grayscale. These subpixels are disposed adjacent to one another. As illustrated in FIG. 1, a terminal section T is provided at the right end portion of the frame region F in the figure. Further, as illustrated in FIG. 1, between the display region D and the terminal section T in the frame region F, the bending section B bendable at 180 degrees (in a U shape) about a bending axis being the vertical direction in the figure is provided to be along one side (right side in the figure) of the display region D.

As illustrated in FIG. 2, the organic EL display device 30a includes, in the display region D, a resin substrate layer 10 provided as a resin substrate, a TFT layer 29 provided on the front surface of the resin substrate layer 10, and an organic EL element 19 provided, as a light-emitting element, on the front surface of the TFT layer 29, a front surface side protection layer 25a provided on the front surface of the organic EL element 19 and a back surface side protection layer 25b provided on the back surface of the resin substrate layer 10.

The resin substrate layer 10 is formed of, for example, a polyimide resin or the like with a thickness of approximately from 10 μm to 20 μm.

As illustrated in FIG. 2, the TFT layer 29 includes a base coat film 11a provided on the resin substrate layer 10, a plurality of first TFTs 12a (see FIG. 3) and a plurality of second TFTs 12b that are provided on the base coat film 11a, and a flattening film 13 provided on the first TFTs 12a and the second TFTs 12b. As illustrated in FIG. 3, the TFT layer 29 is provided with a plurality of gate lines 26 provided, as a metal layer, to extend in parallel to one another in the horizontal direction in the drawing. As illustrated in FIG. 3, the TFT layer 29 is also provided with a plurality of source lines 27a provided, as a metal layer, to extend in parallel to one another in the vertical direction in the drawing. As illustrated in FIG. 3, the TFT layer 29 is further provided with a plurality of power supply lines 27b each provided juxtaposed to each source line 27a to extend in parallel to one another in the vertical direction in the drawing. As illustrated in FIG. 3, the TFT layer 29 is further provided with, in each subpixel, the first TFT 12a, the second TFT 12b, and a capacitor 28.

As illustrated in FIG. 7, the base coat film 11a includes a first layer 11aa provided on the resin substrate layer 10, a second layer 11ab provided on the first layer 11aa, and a third layer 11ac provided on the second layer 11ab. The first layer 11aa is formed with, for example, a silicon oxynitride film or the like with a thickness of approximately 500 nm. The second layer 11ab is formed with, for example, a silicon nitride film or the like with a thickness of approximately from 50 nm to 100 nm. The third layer 11ac is formed with, for example, a silicon oxide film or the like with a thickness of approximately 300 nm.

As illustrated in FIG. 3, the first TFT 12a is coupled to respective gate line 26 and source line 27a in each subpixel. As illustrated in FIG. 3, the second TFT 12b is coupled to respective first TFT 12a and power supply line 27b in each subpixel. The first TFT 12a and the second TFT 12b each include, for example, a semiconductor layer provided in an island shape on the base coat film 11a, a gate insulating film 12aa (see FIG. 6) provided to cover the semiconductor layer, a gate electrode provided, on the gate insulating film 12aa, to partially overlap with the semiconductor layer, a first interlayer insulating film 12ca (see FIG. 6) and a second interlayer insulating film 12da (see FIG. 6) provided, in the order stated, to cover the gate electrode, and a source electrode and a drain electrode arranged on the second interlayer insulating film 12da in a manner spaced apart from each other. Note that the gate insulating film 12aa is formed with, for example, a silicon oxide film or the like with a thickness of approximately 100 nm. Also note that the first interlayer insulating film 12ca is formed with, for example, a silicon nitride film or the like with a thickness of approximately 100 nm. Also, note that the second interlayer insulating film 12da includes, for example, a lower layer formed with a silicon oxide film or the like with a thickness of approximately from 200 nm to 300 nm and an upper layer formed with a silicon nitride film or the like with a thickness of approximately from 150 nm to 200 nm. Although in the first embodiment, the top-gate type is described as an example of the first TFT 12a and the second TFT 12b, the first TFT 12a and the second TFT 12b may be of the bottom-gate type.

As illustrated in FIG. 3, the capacitor 28 is coupled to the respective first TFT 12a and power supply line 27b in each subpixel. The capacitor 28 is formed with, for example, one electrode formed of the same material in the same layer as the gate electrode, the other electrode formed to oppose the one electrode, and a first interlayer insulating film 12ca (see FIG. 6) provided between the pair of the electrodes.

The flattening film 13 is formed of, for example, a colorless and transparent organic resin material, such as a polyimide resin.

As illustrated in FIG. 2, the organic EL element 19 includes a plurality of first electrodes 14, an edge cover 15, a plurality of organic EL layers 16, a second electrode 17, and a sealing film 18, which are provided in the order stated, over the flattening film 13.

As illustrated in FIG. 2, the plurality of first electrodes 14 are provided, each corresponding to each subpixel, in a matrix pattern over the flattening film 13. As illustrated in FIG. 2, the first electrode 14 is connected to the drain electrode of the TFT 12 via a contact hole formed through the flattening film 13. The first electrode 14 functions to inject holes into the organic EL layer 16. It is further preferable that the first electrodes 14 include a material having a large work function to improve the efficiency of hole injection into the organic EL layer 16. Examples of materials that may be included in the first electrode 14 include metal materials, such as silver (Ag), aluminum (Al), vanadium (V), cobalt (Co), nickel (Ni), tungsten (W), gold (Au), calcium (Ca), titanium (Ti), yttrium (Y), sodium (Na), ruthenium (Ru), manganese (Mn), indium (In), magnesium (Mg), lithium (Li), ytterbium (Yb), and lithium fluoride (LiF). Further examples of materials that may be included in the first electrode 14 include alloys, examples of which include magnesium (Mg)-copper (Cu), magnesium (Mg)-silver (Ag), sodium (Na)-potassium (K), astatine (At)-astatine oxide (AtO$_2$), lithium (Li)-aluminum (Al), lithium (Li)-calcium (Ca)-aluminum (Al), and lithium fluoride (LiF)-calcium (Ca)-aluminum (Al). Further examples of materials that may be included in the first electrode 14 include electrically conductive oxides, examples of which include tin oxide (SnO), zinc oxide (ZnO), indium tin oxide (ITO), and indium zinc oxide (IZO). The first electrode 14 may include a stack of two or more layers of any of the above-mentioned materials. Note that, examples of materials having a large work function include indium tin oxide (ITO) and indium zinc oxide (IZO).

As illustrated in FIG. 2, the edge cover 15 is provided in a lattice pattern and surrounds the outer perimeter portion of each first electrode 14. Examples of materials that may be included in the edge cover 15 include an inorganic film, for example, a silicon oxide (SiO$_2$) film, a silicon nitride (SiNx (x is a positive number)) film such as a trisilicon tetranitride (Si$_3$N$_4$) film, or a silicon oxynitride (SiON) film; and an organic film, for example, a polyimide resin film, an acrylic resin film, a polysiloxane resin film, or a novolak resin film.

As illustrated in FIG. 2, the plurality of organic EL layers 16 are provided in a matrix pattern, each being arranged on each first electrodes 14 and each corresponding to each subpixel. As illustrated in FIG. 4, the organic EL layers 16 each include a hole injection layer 1, a hole transport layer 2, a light-emitting layer 3, an electron transport layer 4, and an electron injection layer 5, which are provided in the order stated over the first electrode 14.

The hole injection layer 1 is also referred to as an anode buffer layer, and functions to reduce the energy level difference between the first electrode 14 and the organic EL layer 16, to improve the efficiency of hole injection into the organic EL layer 16 from the first electrode 14. Examples of materials that may be included in the hole injection layer 1 include triazole derivatives, oxadiazole derivatives, imidazole derivatives, polyarylalkane derivatives, pyrazoline derivatives, phenylenediamine derivatives, oxazole derivatives, styrylanthracene derivatives, fluorenone derivatives, hydrazone derivatives, and stilbene derivatives.

The hole transport layer 2 functions to improve the efficiency of hole transport from the first electrode 14 to the organic EL layer 16. Examples of materials that may be included in the hole transport layer 2 include porphyrin derivatives, aromatic tertiary amine compounds, styrylamine derivatives, polyvinylcarbazole, poly-p-phenylenevinylene, polysilane, triazole derivatives, oxadiazole derivatives, imidazole derivatives, polyarylalkane derivatives, pyrazoline derivatives, pyrazolone derivatives, phenylenediamine derivatives, arylamine derivatives, amine-substituted chalcone derivatives, oxazole derivatives, styrylanthracene derivatives, fluorenone derivatives, hydrazone derivatives, stilbene derivatives, hydrogenated amorphous silicon, hydrogenated amorphous silicon carbide, zinc sulfide, and zinc selenide.

The light-emitting layer 3 is a region where holes and electrons recombine when a voltage is applied via the first electrode 14 and the second electrode 17, the holes and electrons are injected from the first electrode 14 and the second electrode 17, respectively. The light-emitting layer 3 is formed of a material having high light-emitting efficiency. Examples of materials that may be included in the light-emitting layer 3 include metal oxinoid compounds (8-hydroxyquinoline metal complexes), naphthalene derivatives, anthracene derivatives, diphenyl ethylene derivatives, vinyl acetone derivatives, triphenylamine derivatives, butadiene derivatives, coumarin derivatives, benzoxazole derivatives, oxadiazole derivatives, oxazole derivatives, benzimidazole derivatives, thiadiazole derivatives, benzothiazole derivatives, styryl derivatives, styrylamine derivatives, bisstyrylbenzene derivatives, trisstyrylbenzene derivatives, perylene derivatives, perinone derivatives, aminopyrene derivatives, pyridine derivatives, rhodamine derivatives, aquidine derivatives, phenoxazone, quinacridone derivatives, rubrene, poly-p-phenylenevinylene, and polysilane.

The electron transport layer 4 functions to facilitate efficient migration of the electrons to the light-emitting layer 3. Examples of materials that may be included in the electron transport layer 4 include organic compounds, example of which include oxadiazole derivatives, triazole derivatives, benzoquinone derivatives, naphthoquinone derivatives, anthraquinone derivatives, tetracyanoanthraquinodimethane derivatives, diphenoquinone derivatives, fluorenone derivatives, silole derivatives, and metal oxinoid compounds.

The electron injection layer 5 functions to reduce the energy level difference between the second electrode 17 and the organic EL layer 16, to improve the efficiency of electron injection into the organic EL layer 16 from the second electrode 17. Because of this function, the driving voltage for the organic EL element 19 can be reduced. Note that the electron injection layer 5 is also referred to as a cathode buffer layer. Examples of materials that may be included in the electron injection layer 5 include inorganic alkaline compound such as lithium fluoride (LiF), magnesium fluoride ($MgF_2$), calcium fluoride ($CaF_2$), strontium fluoride ($Srf_2$), or barium fluoride ($Baf_2$); aluminum oxide ($Al_2O_3$); and strontium oxide (SrO).

As illustrated in FIG. 2, the second electrode 17 is disposed to cover the organic EL layers 16 and the edge cover 15. The second electrode 17 functions to inject electrons into the organic EL layer 16. It is further preferable that the second electrode 17 includes a material having a small work function to improve the efficiency of electron injection into the organic EL layer 16. Examples of materials that may be included in the second electrode 17 include silver (Ag), aluminum (Al), vanadium (V), cobalt (Co), nickel (Ni), tungsten (W), gold (Au), calcium (Ca), titanium (Ti), yttrium (Y), sodium (Na), ruthenium (Ru), manganese (Mn), indium (In), magnesium (Mg), lithium (Li), ytterbium (Yb), and lithium fluoride (LiF). Further examples of materials that may be included in the second electrode 17 include alloys, examples of which include magnesium (Mg)-copper (Cu), magnesium (Mg)-silver (Ag), sodium (Na)-potassium (K), astatine (At)-astatine oxide ($AtO_2$), lithium (Li)-aluminum (Al), lithium (Li)-calcium (Ca)-aluminum (Al), and lithium fluoride (LiF)-calcium (Ca)-aluminum (Al). Further examples of materials that may be included in the second electrode 17 include electrically conductive oxides, examples of which include tin oxide (SnO), zinc oxide (ZnO), indium tin oxide (ITO), and indium zinc oxide (IZO). The second electrode 17 may include a stack of two or more layers of any of the above-mentioned materials. Note that, examples of materials having a small work function include magnesium (Mg), lithium (Li), lithium fluoride (LiF), magnesium (Mg)-copper (Cu), magnesium (Mg)-silver (Ag), sodium (Na)-potassium (K), lithium (Li)-aluminum (Al), lithium (Li)-calcium (Ca)-aluminum (Al), and lithium fluoride (LiF)-calcium (Ca)-aluminum (Al).

As illustrated in FIG. 2, the sealing film 18 is provided to cover the second electrode 17, and functions to protect the organic EL layer 16 from moisture and oxygen. Examples of materials that may be included in the sealing film 18 include inorganic materials, examples of which include silicon oxide ($SiO_2$), aluminum oxide ($Al_2O_3$), silicon nitride (SiNx (x is a positive number)) such as trisilicon tetranitride ($Si_3N_4$), and silicon carbon nitride (SiCN); and organic materials, examples of which include acrylate, polyurea, parylene, polyimide, and polyamide.

The front surface side protection layer 25a and the back surface side protection layer 25b are each formed with, for example, a polyimide resin film or the like with a thickness of approximately 2 μm.

As illustrated in FIG. 5 and FIG. 6, the organic EL display device 30a includes, in the frame region F, a resin substrate layer 10, an inorganic layered film L provided on the front surface of the resin substrate layer 10, a front surface of the inorganic layered film L and an opening portion A provided in the front surface, and a frame wiring line 12ea provided on the front surface of the resin substrate layer 10 exposed through the opening portion A, and a resin film 13a provided to cover the frame wiring line 12ea.

The inorganic layered film L, which is formed with at least one layer of inorganic films included in the TFT layer 29, includes, as illustrated in FIG. 6, a base coat film 11a, a gate insulating film 12aa, a first interlayer insulating film 12ca, and a second interlayer insulating film 12da, which are layered in the order stated over the resin substrate layer 10. As illustrated in FIG. 6 and FIG. 7, at the bending section B of the frame region F in the inorganic layered film L, an opening portion A is formed through the inorganic layered film L to expose the front surface of the resin substrate layer 10. Note that the front surface side protection layer 25a and the back surface side protection layer 25b that are arranged in the display region D is also provided in the most part of the frame region F, but is not provided at the bending section B of the frame region F.

As described above, the base coat film 11a, as illustrated in FIG. 7, includes a first layer 11aa, a second layer 11ab, and a third layer 11ac that are provided in the order stated over the resin substrate layer 10. Here, at the opening portion A, a taper angle θa (see FIG. 8) formed between the front surface of the resin substrate layer 10 and the end face of the first layer 11aa is, for example, 40 degrees, which is not greater than 45 degrees. Similarly, a taper angle θb (see FIG. 8) formed between the front surface of the resin substrate layer 10 and the end face of the second layer 11ab is, for example, 60 degrees. Similarly, a taper angle θc (see FIG. 8) formed between the front surface of the resin substrate layer 10 and the end face of the third layer 11ac is, for example, 30 degrees. Further, as illustrated in FIG. 8, the taper angle θa is greater than the taper angle Oc and is less than the taper angle θb. The opening portion A is formed from one end (upper end in FIG. 1) to the other end (lower end in FIG. 1) of the frame region F along the extending direction (vertical direction in FIG. 1) of the bending section B. Note that the reference sign Ra in FIG. 8 denotes a resist used for patterning by dry etching the layered film of the inorganic insulating films to be the inorganic layered film L.

As illustrated in FIG. 5 and FIG. 6, the frame wiring line 12ea is provided, on the front surface of the resin substrate layer 10 exposed through the opening portion A of the inorganic layered film L and on the surface of the end portion of the inorganic layered film L through which the opening portion A is formed, to extend across the opening portion A. As illustrated in FIG. 6, both end portions of the frame wiring line 12ea are connected, at a portion overlapping with the resin film 13a, to a first gate conductive layer 12ba and a second gate conductive layer 12bb via a first contact hole Ca and a second contact hole Cb, respectively, which are formed through the layered film of the first interlayer insulating film 12ca and the second interlayer insulating film 12da. The frame wiring line 12ea is formed with, for example, a metal layered film of a titanium film (with a thickness of approximately from 30 nm to 200 nm)/an aluminum film (with a thickness of approximately from 100 nm to 1000 nm)/a titanium film (with a thickness of approximately from 30 nm to 200 nm). Note that, although in the first embodiment, the example of the frame wiring line 12*ea* formed with a metal layered film is given, the frame wiring line 12*ea* may also be formed with a metal single layer film. In the first embodiment, the example of the frame wiring line 12*ea* connected to the first gate conductive layer 12*ba* and the second gate conductive layer 12*bb* is given. However, the frame wiring line 12*ea* may be connected, for example, to the source electrode of the first TFT 12*a* (the second TFT 12*b*) or to another conductive layer formed of the same material in the same layer as another electrode or the like of the capacitor 28.

As illustrated in FIG. 6, the first gate conductive layer 12*ba*, which is provided between the gate insulating film 12*aa* and the first interlayer insulating film 12*ca*, is electrically connected to the signal wiring line of the TFT layer 29 (for example, the gate line 26, the source line 27*a*, or the power supply line 27*b*) in the display region D. As illustrated in FIG. 6, the second gate conductive layer 12*bb*, which is provided between the gate insulating film 12*aa* and the first interlayer insulating film 12*ca*, extends to the terminal section T.

The resin film 13*a* is formed of the same material in the same layer as the flattening film 13. As illustrated in FIG. 1, FIG. 5, and FIG. 6, the resin film 13*a* is also provided in a belt form to cover the opening portion A of the inorganic layered film L and the end portion of the inorganic layered film L through which the opening portion A is formed. Note that, in the first embodiment, the example of the resin film 13*a* formed of the same material in the same layer as the flattening film 13 is given. However, the resin film 13*a* may be formed of the same material in the same layer as the edge cover 15 as in the second embodiment described below.

The organic EL display device 30*a* described above is flexible, and is configured, in each subpixel, such that the light-emitting layer 3 of the organic EL layer 16 is caused to appropriately emit light via the first TFT 12*a* and the second TFT 12*b* so that images are displayed.

Figure 9:
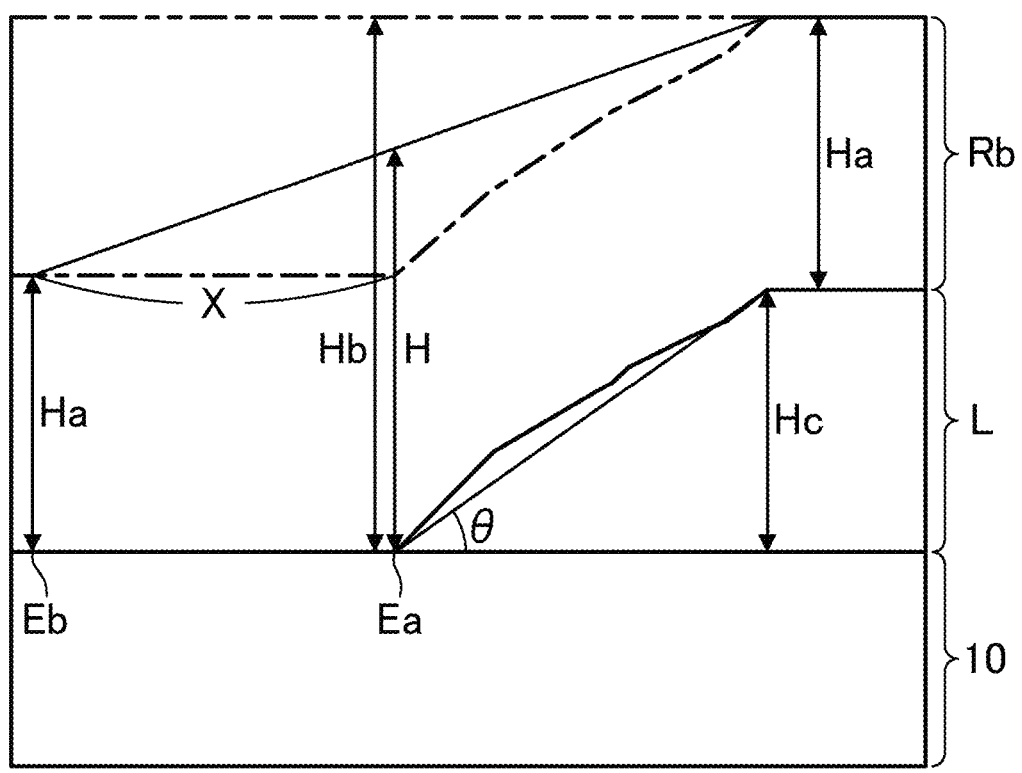
FIG. 9 is a cross-sectional view schematically illustrating a resist formed at an end portion of an inorganic insulating film included in the organic EL display device according to the first embodiment of the disclosure.
Figure 10:
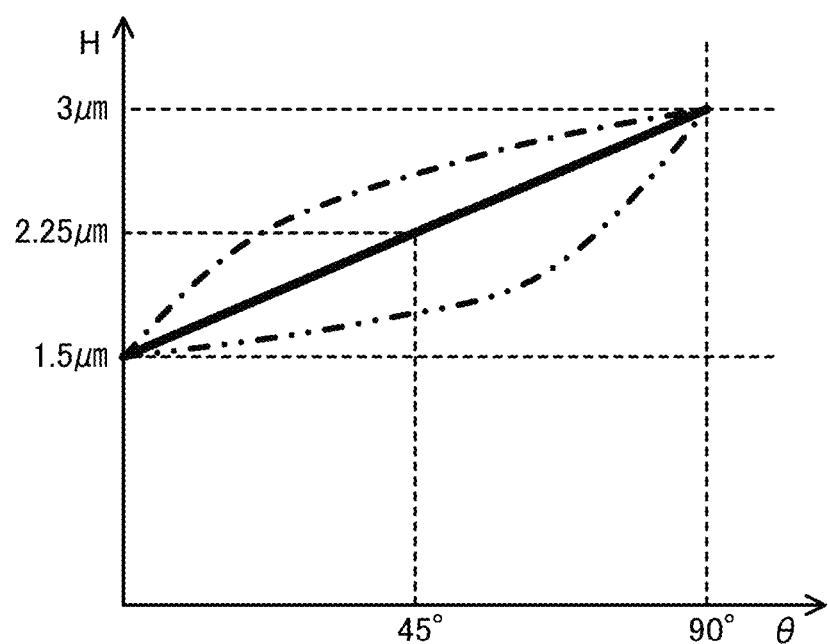
FIG. 10 is a graph illustrating a relationship between a taper angle and a film thickness of a resist at an end portion of the inorganic insulating film in the organic EL display device according to the first embodiment of the disclosure.

Next, the reason for setting the taper angle θa at the end portion of the first layer 11*aa* at 45 degrees or less will be described. Here, FIG. 9 is a cross-sectional view schematically illustrating a resist Rb formed at the end portion of an inorganic layered film L included in the organic EL display device 30*a*. Note that the reference sign Rb in FIG. 9 denotes a resist used for patterning by dry etching a metal conductive film (not illustrated) which is beforehand formed on the inorganic layered film L. FIG. 10 is a graph illustrating, in the organic EL display device 30*a*, the relationship between the taper angle θ at the end portion of the inorganic layered film L and the film thickness H of the resist Rb.

In a case when the resist Rb provided to cover the inorganic layered film L, which is formed to have the same thickness at the step portion of the end portion of the inorganic layered film L as the entire surface of the substrate, the upper surface of the resist Rb is formed along the shape of the end portion of the inorganic layered film L as indicated by the dashed line in FIG. 9. Meanwhile, the upper surface of the resist Rb to be actually formed is formed as indicated by the solid line between the dashed line and the chain double-dashed line in FIG. 9. Note that the chain double-dashed line in FIG. 9 indicates the upper surface of the resist Rb of the (maximum) film thickness Hb combined with the (minimum) film thickness Ha of the resist Rb coated on the upper surface of the resin substrate layer 10 and the (minimum) film thickness Ha of the resist Rb coated on the upper surface of the inorganic layered film L.

Here, provided that the thickness Hc of the inorganic layered film L is 1.5 μm, the thickness Ha of the resist Rb is 1.5 μm, and the thickness of the resist Rb at the end Ea of the step portion of the inorganic layered film L is H, the thickness H is minimized to be 1.5 μm when the taper angle θ formed between the upper surface of the resin substrate layer 10 and the end face of the inorganic layered film is 0 degrees, while is maximized to be 3 μm when the taper angle θ is 90 degrees, as indicated by the solid line in FIG. 10. Further, it is assumed that in a case when the distance X between the end Ea of the step portion of the inorganic layered film L and the end Eb of the resist Rb is relatively long, that is, in a case when the inclination of the end portion of the resist Rb is lenient, the thickness H is indicated by the dashed line in FIG. 10, while in a case when the distance X is relatively short, that is, in a case when the inclination of the end portion of the resist Rb is steep, the thickness H is indicated by the chain double-dashed line in FIG. 10.

First, in a case when the thickness H of the resist Rb at the end Ea of the step portion of the inorganic layered film L is 1.5 μm, the exposure time of the resist can be reduced to 1000 msec, thus suppressing the shift amount of the wiring line formed by patterning the metal conductive film using the resist.

Also, in a case when the thickness H of the resist Rb at the end Ea of the step portion of the inorganic layered film L is 2.25 μm, the exposure time of the resist needs to be 1500 msec, thus, the shift amount of the wiring line formed by patterning the metal conductive film using the resist becomes 1 μm.

Further, in a case when the thickness H of the resist Rb at the end Ea of the step portion of the inorganic layered film L is 3 μm, the exposure time of the resist needs to be 2000 msec, thus, the shift amount of the wiring line formed by patterning the metal conductive film using the resist becomes 2 μm.

Here, the line width of the wiring line normally ranges approximately from 2 μm to 3 μm, thus, the wiring line is narrowed and the wiring line resistance becomes too high when the shift amount of the wiring line exceeds 1 μm. Accordingly, in order to suppress the shift amount of the wiring line to 1 μm or less, the taper angle θ formed between the upper surface of the resin substrate layer 10 and the end face of the inorganic layered film is required to be 45 degrees or less.

The organic EL display device 30*a* of the first embodiment can be manufactured as described below.

For example, the organic EL display device 30*a* can be manufactured such that a TFT layer 29 and an organic EL element 19 are formed, using a well-known method, on the front surface of a resin substrate layer 10 formed on a glass substrate, a front surface side protection layer 25*a* is applied to the organic EL element 19 via an adhesive layer, and then a back surface side protection layer 25*b* is applied to the back surface of the resin substrate layer 10, from which the glass substrate has been peeled off, via an adhesive layer. Prior to the formation of the source electrode and the drain electrode of a first TFT 12*ta* (a second TFT 12*tb*), a collective dry etching using a fluorine-based gas is performed on a layered film of inorganic insulating films to be the inorganic layered film L to form the opening portion A of the inorganic layered film L at the bending section B of the frame region F concurrently with the formation of the first contact hole Ca and the second contact hole Cb. Note that, the lowermost layer of the layered film of the inorganic insulating films, which is formed with a silicon oxynitride film to be the first layer 11*aa* of the base coat film 11*a*, ensures a reliable detection of the end point of the dry etching by means of an intensity change of plasma emission by the nitrogen.

As described above, according to the organic EL display device 30a of the first embodiment, in the inorganic layered film L included in the TFT layer 29, the first layer 11aa of the base coat film 11a at the lowermost layer being in contact with the upper surface of the resin substrate layer 10 is formed with a silicon oxynitride film. Accordingly, in forming by dry etching, at the bending section B of the frame region F, the opening portion A through the inorganic layered film L to expose the upper surface of the resin substrate layer 10, an intensity change of plasma emission by the nitrogen from the silicon oxynitride film ensures a reliable detection of the end point of the dry etching. The silicon oxynitride film, of which the taper angle can be less than the taper angle of the silicon nitride film, makes it possible to reduce the taper angle θa at the first layer 11aa at the lowermost layer of the inorganic layered film L. This ensures a reliable detection of the end point of the dry etching of the inorganic insulating film and makes it possible to reduce the taper angle at the end face of the inorganic insulating film.

The organic EL display device 30a of the first embodiment, in which, at the opening portion A, the taper angle θa formed between the upper surface of the resin substrate layer 10 and the end face of the first layer 11aa at the lowermost layer of the inorganic layered film L is not greater than 45 degrees, suppresses the shift amount of the frame wiring line 12ea to 1 μm or less.

The organic EL display device 30a of the first embodiment, in which the inorganic layered film L does not reside at the bending section B of the frame region F due to the opening portion A of the inorganic layered film L, suppresses film breaking of the inorganic layered film L at the bending section B.

Second Embodiment

Figure 11:
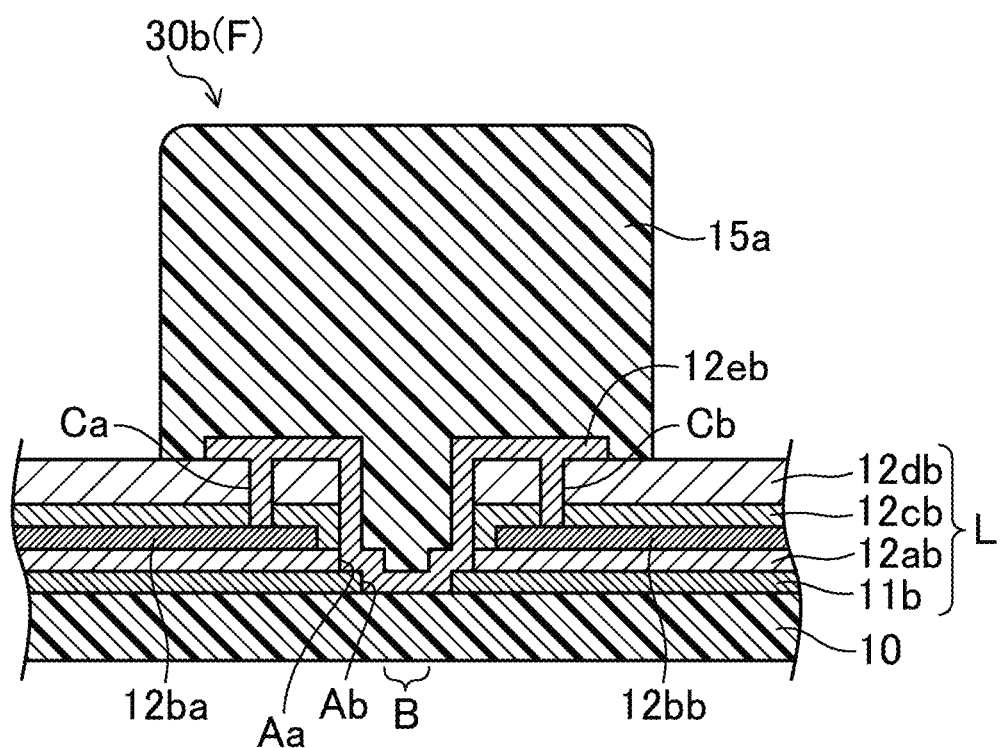
FIG. 11 is a cross-sectional view schematically illustrating an overall configuration of a frame region of the organic EL display device according to the second embodiment of the disclosure, where
Figure 12:
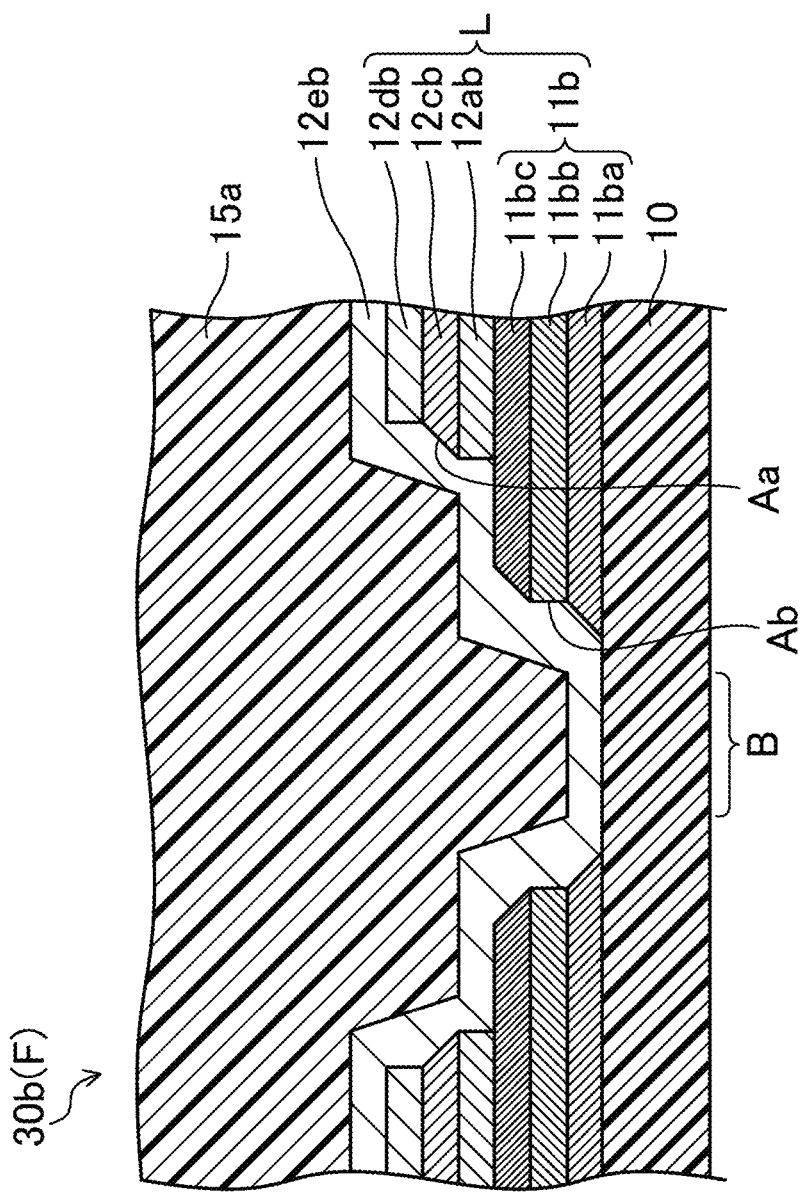
FIG. 12 is a cross-sectional view of a bending section of a frame region of the organic EL display device according to the first embodiment of the disclosure, where

FIG. 11 and FIG. 12 illustrate a second embodiment of the display device according to the disclosure. FIG. 11 is a cross-sectional view schematically illustrating an overall configuration of a frame region F of an organic EL display device 30b of the second embodiment, where FIG. 11 is a view corresponding to FIG. 6. FIG. 12 is a specific cross-sectional view of FIG. 11 enlarging an end portion of the inorganic layered film L included in the organic EL display device 30b, where FIG. 12 is a view corresponding to FIG. 7. Note that, in the following embodiments, portions identical to those in FIG. 1 to FIG. 10 are denoted by the same reference signs, and their detailed descriptions are omitted.

In the first embodiment described above, the example of the organic EL display device 30a manufactured using collective dry etching of the layered film of the inorganic insulating films is given. However, in the second embodiment, an example of an organic EL display device 30b manufactured by dry etching in two steps the layered film of the inorganic insulating films is given.

The organic EL display device 30b, like the organic EL display device 30a of the first embodiment described above, includes a display region D and the frame region F defined around the display region D.

The display region D of the organic EL display device 30b has the same configuration as the organic EL display device 30a of the first embodiment described above.

As illustrated in FIG. 11 and FIG. 12, the organic EL display device 30b includes, in the frame region F, a resin substrate layer 10, an inorganic layered film L provided on the front surface of the resin substrate layer 10, a front surface of the inorganic layered film L and opening portions Aa and Ab formed in the front surface, and a frame wiring line 12eb provided on the front surface of the resin substrate layer 10 exposed through the opening portions Aa and Ab, and a resin film 15a provided to cover the frame wiring line 12eb.

The inorganic layered film L, which is formed with at least one layer of inorganic films included in the TFT layer 29, includes, as illustrated in FIG. 11, a base coat film 11b, a gate insulating film 12ab, and a first interlayer insulating film 12cb, and a second interlayer insulating film 12db, which are layered in the order stated over the resin substrate layer 10. As illustrated in FIG. 11 and FIG. 12, at the bending section B of the frame region F in the inorganic layered film L, opening portions Aa and Ab are formed through the inorganic layered film L to expose the front surface of the resin substrate layer 10.

As illustrated in FIG. 12, the base coat film 11b includes a first layer 11ba, a second layer 11bb, and a third layer 11bc that are provided in the order stated over the resin substrate layer 10. The first layer 11ba is formed with, for example, a silicon oxynitride film or the like with a thickness of approximately 500 nm. The second layer 11bb is formed with, for example, a silicon nitride film or the like with a thickness of approximately from 50 nm to 100 nm. The third layer 11bc is formed with, for example, a silicon oxide film or the like with a thickness of approximately 300 nm. Further, at the opening portion A, the taper angle θa formed between the front surface of the resin substrate layer 10 and the end face of the first layer 11ba is not greater than 45 degrees.

As illustrated in FIG. 11, the frame wiring line 12eb is provided, on the front surface of the resin substrate layer 10 exposed through the opening portions Aa and Ab and the surface of the end portion of the inorganic layered film L through which the opening portions Aa and Ab are formed, to extend across the opening portions Aa and Ab. As illustrated in FIG. 11, both end portions of the frame wiring line 12eb are connected, at a portion overlapping with the resin film 15a, to the first gate conductive layer 12ba and the second gate conductive layer 12bb via a first contact hole Ca and a second contact hole Cb, respectively, which are formed through the layered film of the first interlayer insulating film 12cb and the second interlayer insulating film 12db. The frame wiring line 12eb is formed with, for example, a metal layered film of a titanium film (with a thickness of approximately from 30 nm to 200 nm)/an aluminum film (with a thickness of approximately from 100 nm to 1000 nm)/a titanium film (with a thickness of approximately from 30 nm to 200 nm). The first interlayer insulating film 12cb is formed with, for example, a silicon nitride film with a thickness of approximately 100 nm. The second interlayer insulating film 12db includes, for example, a lower layer formed with a silicon oxide film or the like with a thickness of approximately from 200 nm to 300 nm and an upper layer formed with a silicon nitride film or the like with a thickness of approximately from 150 nm to 200 nm.

The resin film 15a is formed of the same material in the same layer as the edge cover 15. As illustrated in FIG. 11, the resin film 15a is provided in a belt form to cover the opening portions Aa and Ab of the inorganic layered film L and the end portion of the inorganic layered film L through which the opening portions Aa and Ab are formed. Note that, in the second embodiment, the example of the resin film 15a formed of the same material in the same layer as the edge cover 15 is given. However, the resin film 15a may be formed of the same material in the same layer as the flattening film 13 as in the first embodiment described above.

The organic EL display device 30b described above is flexible, and is configured, in each subpixel, such that the light-emitting layer 3 of the organic EL layer 16 is caused to appropriately emit light via the first TFT 12a and the second TFT 12b so that images are displayed.

The organic EL display device 30b of the second embodiment can be manufactured, by dry etching in two steps the opening portion A of the inorganic layered film L, in the method for manufacturing the organic EL display device 30a of the first embodiment described above. More specifically, prior to the formation of the source electrode and the drain electrode of the first TFT 12ta (the second TFT 12tb), a dry etching using a fluorine-based gas is performed on a layered film of inorganic insulating films to be the base coat film 11b through the second interlayer insulating film 12db of the inorganic layered film L to form the opening portion Aa of the inorganic layered film L concurrently with the formation of the first contact hole Ca and the second contact hole Cb. Subsequently, a dry etching using a fluorine-based gas is performed on an inorganic insulating film to be the base coat film 11b of the inorganic layered film L to form the opening portion Ab of the inorganic layered film L.

As described above, according to the organic EL display device 30b of the second embodiment, in the inorganic layered film L included in the TFT layer 29, the first layer 11ba of the base coat film 11b at the lowermost layer being in contact with the upper surface of the resin substrate layer 10 is formed with a silicon oxynitride film. Accordingly, in forming by dry etching, at the bending section B of the frame region F, the opening portion Ab through the inorganic layered film L to expose the upper surface of the resin substrate layer 10, an intensity change of plasma emission by the nitrogen from the silicon oxynitride film ensures a reliable detection of the end point of the dry etching. The silicon oxynitride film, of which the taper angle can be less than the taper angle of the silicon nitride film, makes it possible to reduce the taper angle θa at the first layer 11ba at the lowermost layer of the inorganic layered film L. This ensures a reliable detection of the end point of the dry etching of the inorganic insulating film and makes it possible to reduce the taper angle at the end face of the inorganic insulating film.

The organic EL display device 30b of the second embodiment, in which, at the opening portion A, the taper angle θa formed between the upper surface of the resin substrate layer 10 and the end face of the first layer 11ba at the lowermost layer of the inorganic layered film L is not greater than 45 degrees, suppresses the shift amount of the frame wiring line 12eb to 1 μm or less.

The organic EL display device 30b of the second embodiment, in which the inorganic layered film L does not reside at the bending section B of the frame region F due to the opening portions Aa and Ab of the inorganic layered film L, suppresses film breaking of the inorganic layered film L at the bending section B.

Third Embodiment

Figure 13:
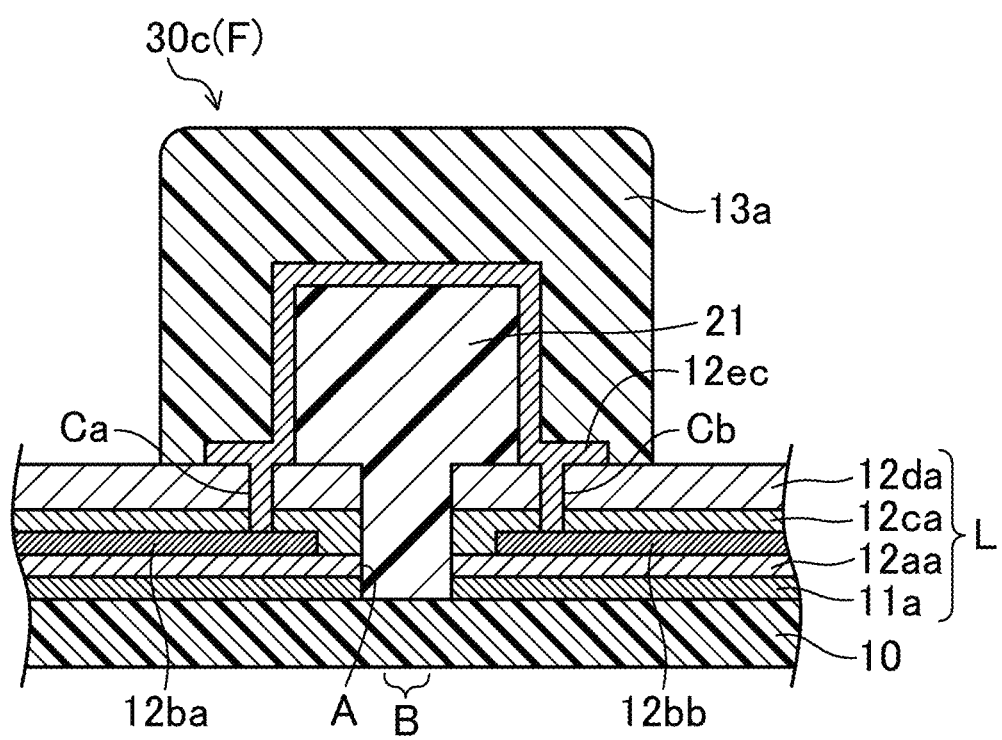
FIG. 13 is a cross-sectional view schematically illustrating an overall configuration of a frame region of the organic EL display device according to the third embodiment of the disclosure, where

FIG. 13 illustrates a third embodiment of the display device according to the disclosure. FIG. 13 is a cross-sectional view schematically illustrating an overall configuration of a frame region F of an organic EL display device 30c of the third embodiment, where FIG. 13 is a view corresponding to FIG. 6.

In the first and second embodiments described above, the examples of the organic EL display devices 30a and 30b in which the frame wiring lines 12ea and 12eb are directly formed on the front surface of the resin substrate layer 10 are given. However, in the third embodiment, an example of the organic EL display device 30c in which a frame wiring line 12ec is formed, with a frame flattening film 21 in between, on the front surface of the resin substrate layer 10 is given.

The organic EL display device 30c, like the organic EL display device 30a of the first embodiment described above, includes a display region D and the frame region F defined around the display region D.

The display region D of the organic EL display device 30c has the same configuration as the organic EL display device 30a of the first embodiment described above.

As illustrated in FIG. 13, the organic EL display device 30c includes, in the frame region F, a resin substrate layer 10, an inorganic layered film L provided on the front surface of the resin substrate layer 10, and a frame flattening film 21 provided to plug an opening portion A formed in the front surface of the inorganic layered film L, the frame wiring line 12ec provided on the front surfaces of the inorganic layered film L and the frame flattening film 21, and a resin film 13a provided to cover the frame wiring line 12ec. Note that, in the third embodiment, the example of the resin film 13a covering the frame wiring line 12ec and formed of the same material in the same layer as the flattening film 13 is given. However, the resin film 13a may be formed of the same material in the same layer as the edge cover 15 as in the second embodiment described above.

The inorganic layered film L, which is formed with at least one layer of inorganic films included in the TFT layer 29, includes, as illustrated in FIG. 13, a base coat film 11a, a gate insulating film 12aa, and a first interlayer insulating film 12ca and a second interlayer insulating film 12da, which are layered in the order stated over the resin substrate layer 10. As illustrated in FIG. 13, at the bending section B of the frame region F in the inorganic layered film L, an opening portion A is formed through the inorganic layered film L to expose the front surface of the resin substrate layer 10.

The frame flattening film 21 is formed with, for example, an organic insulating film such as a polyimide resin film with a thickness of approximately 2 μm.

As illustrated in FIG. 13, both end portions of the frame wiring line 12ec are connected to the first gate conductive layer 12ba and the second gate conductive layer 12bb via a first contact hole Ca and a second contact hole Cb, respectively, which are formed through the layered film of the first interlayer insulating film 12ca and the second interlayer insulating film 12da. The frame wiring line 12ec is formed with, for example, a metal layered film of a titanium film (with a thickness of approximately 200 nm)/an aluminum film (with a thickness of approximately 100 nm)/a titanium film (with a thickness of approximately 200 nm).

The organic EL display device 30c described above is flexible, and is configured, in each subpixel, such that the light-emitting layer 3 of the organic EL layer 16 is caused to appropriately emit light via the first TFT 12a and the second TFT 12b so that images are displayed.

The organic EL display device 30c of the third embodiment can be manufactured such that the opening portion A of the inorganic layered film L is formed and then the frame flattening film 21 is formed to plug the opening portion A in the method for manufacturing the organic EL display device 30a of the first embodiment described above.

As described above, according to the organic EL display device 30c of the third embodiment, in the inorganic layered film L included in the TFT layer 29, the first layer 11aa of the base coat film 11a at the lowermost layer being in contact with the upper surface of the resin substrate layer 10 is formed with a silicon oxynitride film. Accordingly, in forming by dry etching, at the bending section B of the frame region F, the opening portion A through the inorganic layered film L to expose the upper surface of the resin substrate layer 10, an intensity change of plasma emission by the nitrogen from the silicon oxynitride film ensures a reliable detection of the end point of the dry etching. The silicon oxynitride film, of which the taper angle can be less than the taper angle of the silicon nitride film, makes it possible to reduce the taper angle θa at the first layer 11aa at the lowermost layer of the inorganic layered film L. This ensures a reliable detection of the end point of the dry etching of the inorganic insulating film and makes it possible to reduce the taper angle at the end face of the inorganic insulating film.

The organic EL display device 30c of the third embodiment, in which, at the opening portion A, the taper angle θa formed between the upper surface of the resin substrate layer 10 and the end face of the first layer 11aa at the lowermost layer of the inorganic layered film L is not greater than 45 degrees, suppresses the shift amount of the frame wiring line 12ec to 1 μm or less.

The organic EL display device 30c of the third embodiment, in which the inorganic layered film L does not reside at the bending section B of the frame region F due to the opening portion A of the inorganic layered film L, suppresses film breaking of the inorganic layered film L at the bending section B.

Other Embodiments

Figure 14:
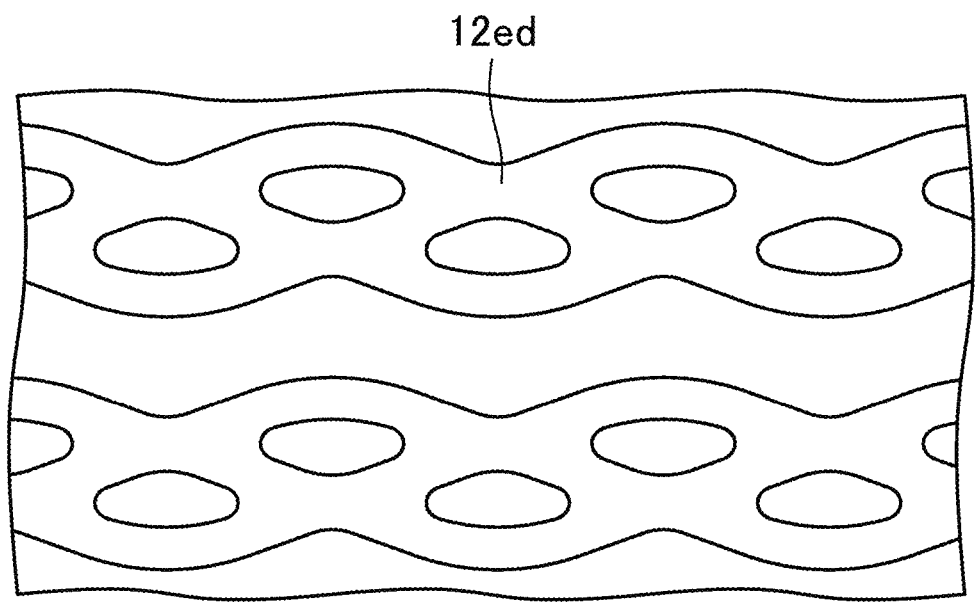
FIG. 14 is a cross-sectional view of frame wiring lines included in the organic EL display device according to another embodiment of the disclosure.

In the above-described embodiments, in the organic EL display devices 30a to 30c, the frame wiring lines 12ea to 12ec are provided in a linear form in a plan view. However, the frame wiring line may be a frame wiring line 12ed provided in a chain form in a plan view as illustrated in FIG. 14.

In the above-described embodiments, the example of the organic EL layer including the five-layer structure including the hole injection layer, the hole transport layer, the light-emitting layer, the electron transport layer, and the electron injection layer is given. It is also possible that, for example, the organic EL layer may include a three-layer structure including a hole injection-cum-transport layer, a light-emitting layer, and an electron transport-cum-injection layer.

In the above-described embodiments, the example of the organic EL display devices including the first electrode as an anode and the second electrode as a cathode is given. However, the disclosure is also applicable to an organic EL display device, in which the layers of the structure of the organic EL layer are in the reverse order, with the first electrode being a cathode and the second electrode being an anode.

In the above-described embodiments, the examples of the organic EL display devices each including an element substrate, in which the electrode of the TFT connected to the first electrode serves as the drain electrode, are given. However, the disclosure is also applicable to an organic EL display device including an element substrate, in which the electrode of the TFT connected to the first electrode is referred to as the source electrode.

In the above-described embodiments, the examples of organic EL display devices described as display device are given. However, the disclosure is applicable to a display device including a plurality of light-emitting elements that are driven by electrical current. For example, the disclosure is applicable to display devices including quantum dot light emitting diodes (QLEDs), which are light-emitting elements using a quantum dot-containing layer.

INDUSTRIAL APPLICABILITY

As described above, the disclosure is useful for flexible display devices.

REFERENCE SIGNS LIST

A, Aa, Ab Opening portion
B Bending section
Ca First contact hole
Cb Second contact hole
D Display region
F Frame region
T Terminal section
10 Resin substrate layer (resin substrate)
11a to 11b Base coat film (inorganic insulating film)
11aa, 11ba First layer
11ab, 11bb Second layer
11ac, 11bc Third layer
12aa, 12ab Gate insulating film (inorganic insulating film)
12ba First gate conductive layer (first conductive layer)
12bb Second gate conductive layer (second conductive layer)
12ca, 12cb First interlayer insulating film (inorganic insulating film)
12da, 12db Second interlayer insulating film (inorganic insulating film)
12ea to 12ed Frame wiring line
13 Flattening film
13a Resin film
15 Edge cover
15a Resin film
19 Organic EL element (light-emitting element)
26 Gate line (metal layer)
27a Source line (metal layer)
27b Power supply line (metal layer)
29 TFT layer
30a to 30c Organic EL display device

The invention claimed is:
1. A display device comprising:
a resin substrate;
a light-emitting element included in a display region, the light-emitting element being provided over the resin substrate with a TFT layer in between;
a frame region provided around the display region;
a terminal section provided at an end portion of the frame region;
a bending section provided between the display region and the terminal section;
a frame wiring line provided in the frame region, the frame wiring line extending to the terminal section and being electrically connected, via the TFT layer, to the light-emitting element; and at least one inorganic insulating film provided in the frame region, the at least one inorganic insulating film being overlaid on the resin substrate and being included in the TFT layer, wherein at the bending section, an opening portion is formed through the at least one inorganic insulating film to expose an upper surface of the resin substrate, the frame wiring line is provided, on the resin substrate exposed through the opening portion and on an end portion of the inorganic insulating films through which the opening portion is formed, to extend across the opening portion, among the at least one inorganic insulating film, an inorganic insulating film being in contact with the upper surface of the resin substrate is formed with a silicon oxynitride film, among the at least one inorganic insulating film, an inorganic insulating film being in contact with the upper surface of the resin substrate is a lowermost layer of a base coat film provided on the resin substrate, and the base coat film includes a first layer formed with a silicon oxynitride film, a second layer formed with a silicon nitride film, and a third layer formed with a silicon oxide film, which are provided in an order stated over the resin substrate.

2. The display device according to claim 1, wherein at the opening portion, the taper angle formed between the upper surface of the resin substrate and an end face of the first layer is greater than a taper angle formed between the upper surface of the resin substrate and an end face of the third layer and is less than a taper angle formed between the upper surface of the resin substrate and an end face of the second layer.

3. The display device according to claim 1, wherein at the opening portion, the taper angle formed between the upper surface of the resin substrate and an end face of the inorganic insulating film among the at least one inorganic insulating film, which is in contact with the upper surface of the resin substrate, is 45 degrees or less.

4. The display device according to claim 1, wherein the frame wiring line is covered with a resin film.

5. The display device according to claim 4, wherein the TFT layer includes a flattening film, and
the resin film is formed of the same material in the same layer as the flattening film.

6. The display device according to claim 4, wherein the light-emitting element includes an edge cover, and
the resin film is formed of the same material in the same layer as the edge cover.

7. The display device according to claim 4, wherein the opening portion is formed from one end to the other end of the frame region along the bending section, and
the resin film is provided in a belt form to cover the opening portion and an end portion of the at least one inorganic insulating film through which the opening portion is formed.

8. The display device according to claim 7, wherein the at least one inorganic insulating film includes a plurality of inorganic insulating films,
the TFT layer includes a metal layer,
between the plurality of inorganic insulating films in the frame region, a first conductive layer and a second conductive layer formed of the same material in the same layer as the metal layer are provided with the opening portion interposed in between, the first conductive layer is provided to extend toward the display region, while the second conductive layer is provided to extend to the terminal section, and
one end portion of the frame wiring line is electrically connected, at a portion overlapping with the resin film, to the first conductive layer via a first contact hole formed in the plurality of inorganic insulating films, while the other end portion of the frame wiring line is electrically connected, at a portion overlapping with the resin film, to the second conductive layer via a second contact hole formed in the plurality of inorganic insulating films.

9. The display device according to claim 1, wherein the light-emitting element includes an organic EL element.

10. A display device comprising:
a resin substrate;
a light-emitting element included in a display region, the light-emitting element being provided over the resin substrate with a TFT layer in between;
a frame region provided around the display region;
a terminal section provided at an end portion of the frame region;
a bending section provided between the display region and the terminal section;
a frame wiring line provided in the frame region, the frame wiring line extending to the terminal section and being electrically connected, via the TFT layer, to the light-emitting element; and
at least one inorganic insulating film provided in the frame region, the at least one inorganic insulating film being overlaid on the resin substrate and being included in the TFT layer, wherein at the bending section, an opening portion is formed through the at least one inorganic insulating film to expose an upper surface of the resin substrate, the frame wiring line is provided, on the resin substrate exposed through the opening portion and on an end portion of the inorganic insulating films through which the opening portion is formed, to extend across the opening portion, among the at least one inorganic insulating film, an inorganic insulating film being in contact with the upper surface of the resin substrate is formed with a silicon oxynitride film, and at the opening portion, the taper angle formed between the upper surface of the resin substrate and an end face of the inorganic insulating film among the at least one inorganic insulating film, which is in contact with the upper surface of the resin substrate, is 45 degrees or less.

11. The display device according to claim 10, wherein among the at least one inorganic insulating film, an inorganic insulating film being in contact with the upper surface of the resin substrate is a lowermost layer of a base coat film provided on the resin substrate.

12. The display device according to claim 10, wherein the frame wiring line is covered with a resin film.

13. The display device according to claim 12, wherein the TFT layer includes a flattening film, and
the resin film is formed of the same material in the same layer as the flattening film.

14. The display device according to claim 12, wherein the light-emitting element includes an edge cover, and
the resin film is formed of the same material in the same layer as the edge cover.

15. The display device according to claim 12, wherein
the opening portion is formed from one end to the other end of the frame region along the bending section, and
the resin film is provided in a belt form to cover the opening portion and an end portion of the at least one inorganic insulating film through which the opening portion is formed.

16. The display device according to claim 15, wherein
the at least one inorganic insulating film includes a plurality of inorganic insulating films,
the TFT layer includes a metal layer,
between the plurality of inorganic insulating films in the frame region, a first conductive layer and a second conductive layer formed of the same material in the same layer as the metal layer are provided with the opening portion interposed in between,
the first conductive layer is provided to extend toward the display region, while the second conductive layer is provided to extend to the terminal section, and
one end portion of the frame wiring line is electrically connected, at a portion overlapping with the resin film, to the first conductive layer via a first contact hole formed in the plurality of inorganic insulating films, while the other end portion of the frame wiring line is electrically connected, at a portion overlapping with the resin film, to the second conductive layer via a second contact hole formed in the plurality of inorganic insulating films.

17. The display device according to claim 10, wherein the light-emitting element includes an organic EL element.

* * * * *